(12) United States Patent
Caranci et al.

(10) Patent No.: US 8,407,645 B1
(45) Date of Patent: Mar. 26, 2013

(54) GRAPHICAL BLOCK-BASED DESIGN EXPLORATION TOOL

(75) Inventors: Steven Caranci, Toronto (CA);
Alexander Grbic, Mississauga (CA);
Mark Ari Teper, Toronto (CA)

(73) Assignee: Altera Corporation, San Jose, CA (US)

( * ) Notice: Subject to any disclaimer, the term of this patent is extended or adjusted under 35 U.S.C. 154(b) by 513 days.

(21) Appl. No.: 12/354,580

(22) Filed: Jan. 15, 2009

Related U.S. Application Data (60) Provisional application No. 61/085,793, filed on Aug. 1, 2008.

(51) Int. Cl.
*G06F 17/50* (2006.01)
(52) U.S. Cl. .......................... 716/126; 716/127
(58) Field of Classification Search ........... 716/116–120
See application file for complete search history.

(56) References Cited

U.S. PATENT DOCUMENTS

| | | | |
|---|---|---|---|
| 6,260,182 B1* | 7/2001 | Mohan et al. | 716/121 |
| 6,292,925 B1* | 9/2001 | Dellinger et al. | 716/113 |
| 6,301,686 B1* | 10/2001 | Kikuchi et al. | 716/122 |
| 6,317,864 B1* | 11/2001 | Kikuchi et al. | 716/122 |

* cited by examiner

*Primary Examiner* — Binh Tat
(74) *Attorney, Agent, or Firm* — Weaver Austin Villeneuve & Sampson LLP (57) ABSTRACT

A graphical block-based design exploration tool displays multiple views of a chip design. These views may include a logical view, physical view, hierarchy view, and a timing display view, displayed side-by-side or sequentially with or without animation. Various entities and their relationships to each other are displayed in these different view arrangements to allow a user to quickly grasp the entire design and to perform design techniques such as partitioning and floor planning. The display properties are user configurable to organize the information based on user preferences.

20 Claims, 10 Drawing Sheets

| Fitter Resource Utilization by Entity | | | | | | |
|---|---|---|---|---|---|---|
| | Compilation Hierarchy Node | Combinational ALUTs | Memory ALUTs | LUT_REGs | ALMs | Dedicated Logic Registers |
| 1 | ⊟ |mercury_top | 44598(4) | 30(0) | 0(0) | 31895(1) | 37094 (0) |
| 2 | ⊟ I4_tdes_blocks_2:inst1| | 21610(1) | 0(0) | 0(0) | 16255(1) | 19064 (0) |
| 3 | ⊟ |lpm_dff0:inst8| | 0(0) | 0(0) | 0(0) | 251 (0) | 256 (0) |
| 4 | ··|lpm_ff:lpm_ff_component| | 0(0) | 0(0) | 0(0) | 251 (251) | 256 (256) |
| 5 | ⊟ |lpm_dff1:inst11| | 0(0) | 0(0) | 0(0) | 64 (0) | 64 (0) |
| 6 | ··|lmp_ff:lpm_ff_component| | 0(0) | 0(0) | 0(0) | 64 (64) | 64 (64) |
| 7 | ⊟ |lpm_mux0::inst5| | 65(0) | 0(0) | 0(0) | 64 (0) | 0 (0) |
| 8 | ⊟ |lpm_mux:lpm_mux_component| | 65(65) | 0(0) | 0(0) | 64 (0) | 0 (0) |
| 9 | ··|mus_ssc:auto_generated| | 65(65) | 0(0) | 0(0) | 64 (64) | 0 (0) |
| 10 | ⊟ |lpm_shiftreg4:inst14| | 0(0) | 0(0) | 0(0) | 125 (0) | 168 (0) |
| 11 | ··|lpm_shiftreg:lpm_shiftreg_component| | 0(0) | 0(0) | 0(0) | 125 (125) | 168 (168) |
| 12 | ⊟ |loc_des_des3perf:inst1| | 5388(0) | 0(0) | 0(0) | 6104 (0) | 3869 (0) |
| 13 | ⊟ |des3:desinst| | 5388(0) | 0(0) | 0(0) | 6104 (0) | 3869 (0) |
| 14 | ⊟ |des:u0| | 1794(512) | 0(0) | 0(0) | 2001 (987) | 1256 (1088) |
| 15 | ⊟ |crp:u0| | 80(48) | 0(0) | 0(0) | 78 (46) | 0 (0) |
| 16 | ··|sbox1:u0| | 4(4) | 0(0) | 0(0) | 4 (4) | 0 (0) |
| 17 | ··|sbox2:u1| | 4(4) | 0(0) | 0(0) | 4 (4) | 0 (0) |
| 18 | ··|sbox3:u2| | 4(4) | 0(0) | 0(0) | 4 (4) | 0 (0) |
| 19 | ··|sbox4:u3| | 4(4) | 0(0) | 0(0) | 4 (4) | 0 (0) |
| 20 | ··|sbox5:u4| | 4(4) | 0(0) | 0(0) | 4 (4) | 0 (0) |
| 21 | ··|sbox6:u5| | 4(4) | 0(0) | 0(0) | 4 (4) | 0 (0) |
| 22 | ··|sbox7:u6| | 4(4) | 0(0) | 0(0) | 4 (4) | 0 (0) |
| 23 | ··|sbox8:u7| | 4(4) | 0(0) | 0(0) | 4 (4) | 0 (0) |
| 24 | ⊟ |crp:u10| | 80(48) | 0(0) | 0(0) | 78 (46) | 0 (0) |

Figure 1A. Hierarchical Table View of a Portion of a Design

Figure 1B. Schematic View of a Design

GRAPHICAL BLOCK-BASED DESIGN EXPLORATION TOOL

CROSS-REFERENCE TO RELATED APPLICATIONS

This application claims priority of provisional U.S. Patent Application Ser. No. 61/085,793, filed Aug. 1, 2008, entitled "GRAPHICAL BLOCK-BASED DESIGN EXPLORATION TOOL" which is incorporated by reference herein in its entirety for all purposes.

FIELD OF THE INVENTION

The present disclosure generally relates to programmable logic devices, and more particularly, to a tool or process for designing programmable logic devices.

BACKGROUND

A Programmable Logic Device (PLD) is a semiconductor integrated circuit that contains fixed logic circuitry that can be programmed to perform a host of logic functions. In the semiconductor industry, PLDs have become increasingly popular for a number of reasons. Due to advances in chip manufacturing technology, PLDs have improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with Application-Specific Integrated Chips (ASICs) and reduced product development times makes it compelling for many Original Equipment Manufacturers (OEMs) to integrate PLDs into their device designs.

The PLD design process is constantly improved and streamlined. One such improvement involves design tools. Traditionally, a PLD designer describes the logic and functions of a PLD using a hardware description language such as Verilog, VHDL or Abel. Increasingly, the hardware description language (HDL) files are generated by design tools based on inputs from the PLD designer/user. These design tools utilize libraries of IP (intellectual property) cores to build the HDL while still allowing the user to customize the PLD logic. These design tools reduce errors and the amount of time needed to generate an HDL file.

SUMMARY

A graphical block-based design exploration tool displays multiple views of a chip design. These views may include a logical view, physical view, hierarchy view, and a timing display view, displayed side-by-side or sequentially with or without animation. Various entities and their relationships to each other are displayed in these different view arrangements to allow a user to quickly grasp the entire design and to perform design techniques such as partitioning and floor planning. The display properties are user configurable to organize the information based on user preferences.

According to various embodiments, a method of presenting chip design in a logical view on a display is disclosed. The method includes displaying entities and displaying at least one bundle connecting two of the entities on the display. An entity represents a design block or a group of design blocks and has a relative size based on a specified variable. This variable may be a number of logic elements, number of a specific kind of logic (e.g., DSP or RAMs), a weighted sum of the nodes, a minimum area required on the chip for the physical resources of the entity, a bounding box, a slack ratio, or a user definable parameter. A user may also configure the logical view such that only a certain type of entity(s) is shown. Each bundle has a configurable label. This label may be configured to be the number of physical or logical connections in one direction or a sum of connections in both directions, and may include additional information such as the number of failing connections, the number of registered connections, the worst-case slack, and other user definable parameters. Other indicators such as line color and thickness may be used to indicate various bundle states. Bundles to input/output banks may be displayed or not.

The method may include displaying a partition, displaying input/output banks, or displaying children of an entity. A partition includes at least one entity and may be represented graphically using color or highlights. The input/output banks are arranged at the periphery of the display and may approximate to relative physical locations of the input/output banks on a chip, for example, a PLD chip. Child(ren) of an entity may be extracted from their parent(s) and displayed as a separate block(s).

According to various embodiments, the logical view may be arranged according to various user preferences. For example, the blocks may be arranged according to the number of connections so as to minimize the length of bundles displayed. In certain embodiments, the logical view does not shown hierarchical relationship between entities.

Other aspects of the present invention involve graphical presentations of embodiments of a chip design on a display. A graphical presentation may include a plurality of entities, one or more input/output banks, and one or more bundles connecting at least one entity to another entity or to an input/output bank. Another graphical presentation may include a logical view having a plurality of entities, one or more partitions, and one or more bundles connecting at least one entity to another entity or to an input/output bank. The graphical presentation may include a physical view of a PLD, showing the design elements in their approximate physical locations on a PLD chip with a partition indicator. For example, a partition having many design blocks may be shown in a same color in both the logical view and the physical view.

According to various embodiments, yet another aspect of the invention pertains to a method of presenting a chip design by displaying a logical view and animating the entities in the logical view to display a hierarchy view. In certain embodiments, the method also includes animating the entities in the hierarchy view to display the logical view.

In other embodiments, a method of presenting a chip design includes displaying a logical view of the chip design and displaying a physical view of the chip design next to the logical view. If a user selects a partition in the logical view, the corresponding partition is indicated in the physical view, and vice versa. The partition property may be modified in one view and the modified property displayed in both views. For example, changing the partition property of a design block in the logical view would also change its color coding in the physical view.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION

Introduction

Programming a PLD requires both logic description design and physical design. Electronic design automation (EDA) tools assist designers by automating hardware description language generation. A designer inputs information to customize the logic on the PLD, and the tool utilizes libraries of IP cores to complete the description. Some EDA tools can also generate schematics of the design. These schematics show the logic structure at the gate or block level and consist of thousands of blocks in complex hierarchies. In addition to schematics, tables and outline views of the blocks and hierarchies are also available. The hierarchical and schematic design views are often hard to understand for large or complex designs.

Figure 2:
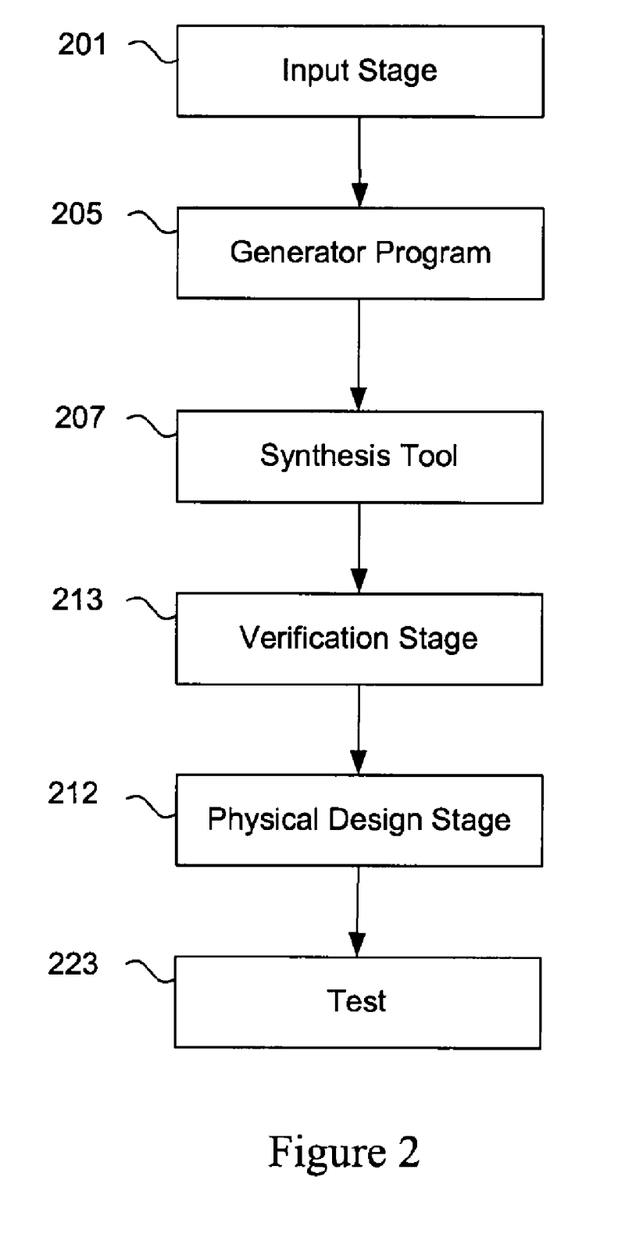
FIG. 2 is a diagrammatic representation showing a technique for design and implementation of a programmable chip.

A brief overview of a PLD design process is disclosed herein in reference to FIG. 2 to provide context for the present invention. FIG. 2 is a diagrammatic representation showing a FPGA design process. An input stage 201 receives selection information to be implemented on an electronic device. Typically, the selection information is from a user for logic such as a processor core, and/or other components, such as a streaming output device. In one example, the input received is in the form of a high-level language program. A generator program 205 creates a logic description and provides the logic description along with other customized logic to any of a variety of synthesis tools, place and route programs, and logic configuration tools to allow a logic description to be implemented on an electronic device. In one example, an input stage 201 often allows selection and parameterization of components to be used on an electronic device. The input stage 201 also allows configuration of variable or fixed latency support. In some examples, components provided to an input stage include intellectual property functions, megafunctions, and intellectual property cores. The input stage 201 may be a graphical user interface using wizards for allowing efficient or convenient entry of information. The input stage may also be a text interface or a program reading a data file such as a spreadsheet, database table, or schematic to acquire selection information. The input stage 201 produces an output containing information about the various modules selected.

In typical implementations, the generator program 205 can identify the selections and generate a logic description with information for implementing the various modules. The generator program 205 can be a Perl script creating HDL files such as Verilog, Abel, VHDL, or AHDL files from the module information entered by a user. In one example, the generator program identifies a portion of a high-level language program to accelerate. The other code is left for execution on a processor core. According to various embodiments, the generator program 205 identifies pointers and provides ports for each pointer. One tool with generator program capabilities is System on a Programmable Chip (SOPC) Builder available from Altera Corporation of San Jose, Calif. The generator program 205 also provides information to a synthesis tool 207 to allow HDL files to be automatically synthesized. In some examples, a logic description is provided directly by a designer. Hookups between various components selected by a user are also interconnected by a generator program. Some of the available synthesis tools are Quartus Integrated Synthesis (QIS) from Altera Corporation of San Jose, Calif., Precision Synthesis, available from Mentor Graphics Corporation of Wilsonville, Oregon and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 201, generator program 205, and synthesis tool 207 can be separate programs. The interface between the separate programs can be a database file, a log, or simply messages transmitted between the programs. For example, instead of writing a file to storage, the input stage 201 can send messages directly to the generator program 205 to allow the generator program to create a logic description. Similarly, the generator program can provide information directly to the synthesis tool instead of writing HDL files. Similarly, input stage 201, generator program 205, and synthesis tool 207 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDIF file). An EDIF file is one example of a synthesized netlist file that can be output by the synthesis tool 207.

A synthesis tool 207 can take HDL files and output EDIF files or other netlist description formats such as structural VHDL or structural Verilog. Tools for synthesis allow the implementation of the logic design on an electronic device. Various synthesized netlist formats will be appreciated by one of skill in the art.

A verification stage 213 may precede or follow the synthesis stage 207. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 213, the synthesized netlist file can be provided to physical design tools 212 including place and route and configuration tools. A place and route tool typically locates logic cells on specific logic elements of a target hardware device and connects wires between the inputs and outputs of the various logic elements in accordance with logic required to implement an electronic design. This is usually followed by a final timing analysis step to sign off on the timing constraints, now that all the actual timing paths between sequential elements on the device are known. The device can also be physically tested at 223.

For programmable logic devices, a programmable logic configuration stage can take the output of the place and route tool and generate a bit stream that is used to program the logic device with the user selected and parameterized modules. According to various embodiments, the place and route tool and the logic configuration stage are provided in the Quartus Development Tool, available from Altera Corporation of San Jose, Calif.

As noted above, different stages and programs can be integrated in a variety of manners. According to one embodiment, the input stage 201, the generator program 205, the synthesis tool 207, the verification tools 213, and physical design tools 212 are integrated into a single program. The various stages may be automatically run and transparent to a user. The program can receive the user selected modules, generate a logic description depicting logic for implementing the various selected modules, and implement the electronic device. Various stages may be repeated in an iterative process to troubleshoot and optimize a design. It is common for a design to be compiled many times before it is finalized.

As PLD technology advances, the designs get larger and more complex. These larger and more complex designs make compiles longer and timing closure harder and may require many developers working together on a team. Advanced design techniques are used to aid designers of large and complex designs. To reduce compile time, advanced EDA tools offer incremental compilation options. The user may split the design into parts, also known as partitions, and compile each part separately. A developer on a team may compile and optimize his portion of the design quickly and separately from the rest of the team. Once all of the pieces are complete, the individually compiled portions are combined. Advanced design tools allow locking of particular partition properties, e.g., placement or routing, when a design is combined. Because the partitions are compiled and optimized separately, the effectiveness of incremental compiling depends in large part on the original partitioning. Well partitioned designs combine into an effective final device. Designs that are not partitioned well may be inefficient.

Generally, better partitions are of approximately equal size, created in an independent file, avoid dependencies on the same lower-level entity definition, function mostly independently with more signal interaction internally than outside of the partition, have different clock domains and have isolated timing—critical logic. Because inter-partition optimization is limited, inputs and outputs of a partition are minimized and preferably registered. A designer uses data available in various tools and views to follow these and other guidelines for better partitions. For example, a user may analyze an outline table of various partitions to determine whether the partitions are of equal size, but to review inter-partition inputs and outputs the user may have to review connection data in other tools and views. A user would have to navigate several tools and screens and keep track of various data.

Another advanced design technique is floor planning. Areas on the chip are optimized to minimize size of buses and the number of interconnects. Modules that have a high number of interconnections are placed close to each other so as to minimize the length of interconnects. Modules are also placed closer to the input/output banks to which they route information more often. Some of these design techniques are performed through an EDA tool, while others are affected by choices a designer makes. For example, pin assignments and partitions chosen by a designer may affect the efficiency of a layout.

A design tool is disclosed herein to assist designers, especially for large and complex designs. The design tool provides a graphical environment for investigating design structure, identifying timing and connectivity issues, controlling and manipulating incremental compilation and floor planning, managing team-based design, and entering block-based design information. Information needed to understand a design is displayed at a high level block diagram so that a designer does not need to use a number of tools. Usually, but not always, the displaying occurs on a computer monitor. However, the information may also be conveyed by printing, projecting, and other visualization techniques. The graphical environment presents data that has previously been available only in textual format or in detailed gate-level schematics. It allows a user to identify partitioning candidates and immediately receive feedback on the suitability of the candidates. The feedback includes an estimate how the partitioning and/or floor planning will alter the design. This kind of feedback was previously only available with a recompilation, which may be time consuming. Thus a designer can investigate what-if scenarios before committing to a particular partitioning scheme. The graphical environment also provides an interface for bottom-up team based designs. Through this interface, timing and connectivity issues between independently developed blocks can be identified for correction. Note that this design tool may be used at various stages of the design process discussed above. Because certain information only becomes available after certain stages of the process, various views in the design tool may not be available at the beginning of the process. For example, the physical view is available only after the design is completely compiled once. Thus, the design tool reduces the number of subsequent compiles but at least one compile is still used.

Figure 1A:
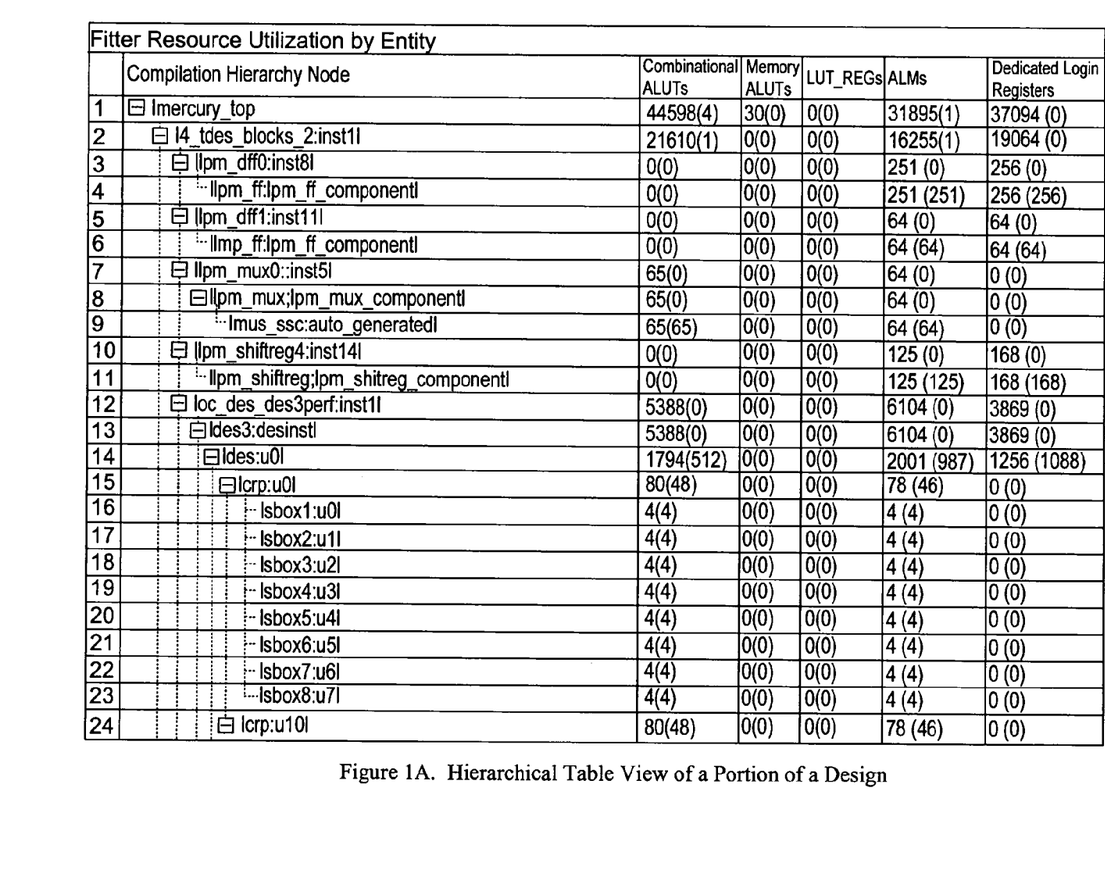
FIGS. 1A and 1B are diagrammatic representations of the logical structure of a PLD device.
Figure 1B:
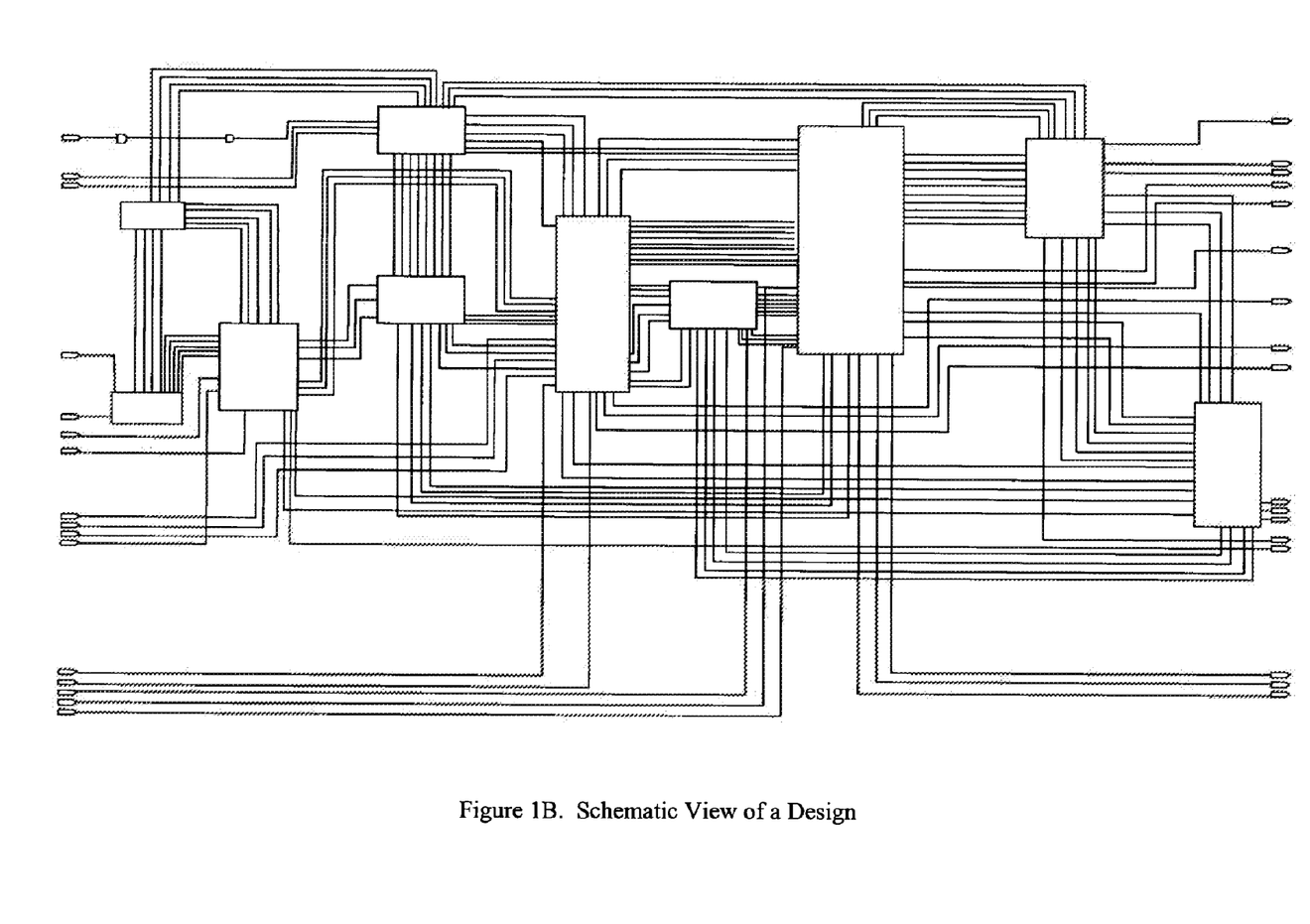

While most EDA design tools provide the information required for users to accomplish these tasks, the data is not presented in a manner that is conducive to quick and intuitive interpretation. Most of the information required is made available either through a combination of text based tables (FIG. 1A) or contained within a number of other tools (such as a physical view, a gate level view (FIG. 1B)). This can make it difficult to visualize at a high level. The design tool disclosed herein provides an infinite canvas on which the user can place high-level schematic blocks or "entities." Entities may include blocks representing logic, groups of blocks representing a partition, input/output banks, and bundles connecting various blocks and input/output banks. The user may configure the presentation of these entities and in some cases definitions of the entities based on design process and requirements. The entities may be shown in a logical view, a hierarchy view, a time display view, a physical view, or a combination of these on the same screen or alternating screens. Through the configuration and various views, a user can explore the design at different levels of detail. This ability also aids the practice of advanced design techniques such as partitioning and floor planning.

In accordance with various embodiments of the present invention, one feature of this tool is the display of the schematic blocks and the relationships between them. Intuitive graphics show which blocks are connected to each other and to input/output banks, with selected information about the connection. Annotated onto each block and each connection between blocks are details of the user's design, which may be selected to reveal more information. Thus, at a high level, a user can quickly grasp the entire design without wading through multiple detailed views.

Another feature of this tool may be the simultaneous and on the same level display of entities from any point in the design hierarchy. Related blocks may be displayed individually or together, or in a mixed mode. A user can select to see a parent block and a grandchild block while keeping the child(ren) block(s) with the parent block. Design exploration of various partitioning combinations is the not limited in familial structures.

In accordance with various embodiments, yet another feature of this tool is configurability for presentation of data. A user may define rules and customize data in many ways, e.g., to determine the sizes of the blocks, types of connections to be counted, presentation of bundles, the types of information to include with each block, or even whether various entities are shown. A designer can configure this tool to organize the information in a way that is most useful to the design without having to separately process the information from the detailed views.

Still another feature of embodiments of this tool is the ease of moving between different views. The blocks animate to alternate between a logical view of the canvas and a hierarchical view. A designer can reorient a block in the overall hierarchy without losing track of surrounding blocks. Side by side views are available for the canvas and physical view to see how the blocks are located on the physical chip.

The Canvas or Logical View

The canvas or the logical view displays various entities. A design block is the basic entity and may form a partition by itself or with other design blocks. Entities may be displayed with a label, a hierarchy icon, a top level logic area, and a set of boxes representing children, if any. The label may indicate the name of the entity and its base color, which corresponds to the color of the entity in other views and tools. Long text names may be truncated to fit in the label area of the entity. The hierarchy icon allows toggling to the hierarchy view. The logic area may be shown as a bar or a box below the label. Its height or size may roughly correspond to the amount of logic in the entity, without counting the logic in any children. The color of the logic area may represent a state. For example, a red logic area may indicate that there is a failing path in the top level logic of this entity. The set of boxes representing children may each also have boxes indicating a state. For example, children containing failing paths may be shown in red. Fewer items may be displayed with each entity depending on the relative space available. For example, when the entities are small because more entities are on the canvas, i.e., in zoomed out view, the set of boxes representing children may not be shown.

Figure 3:
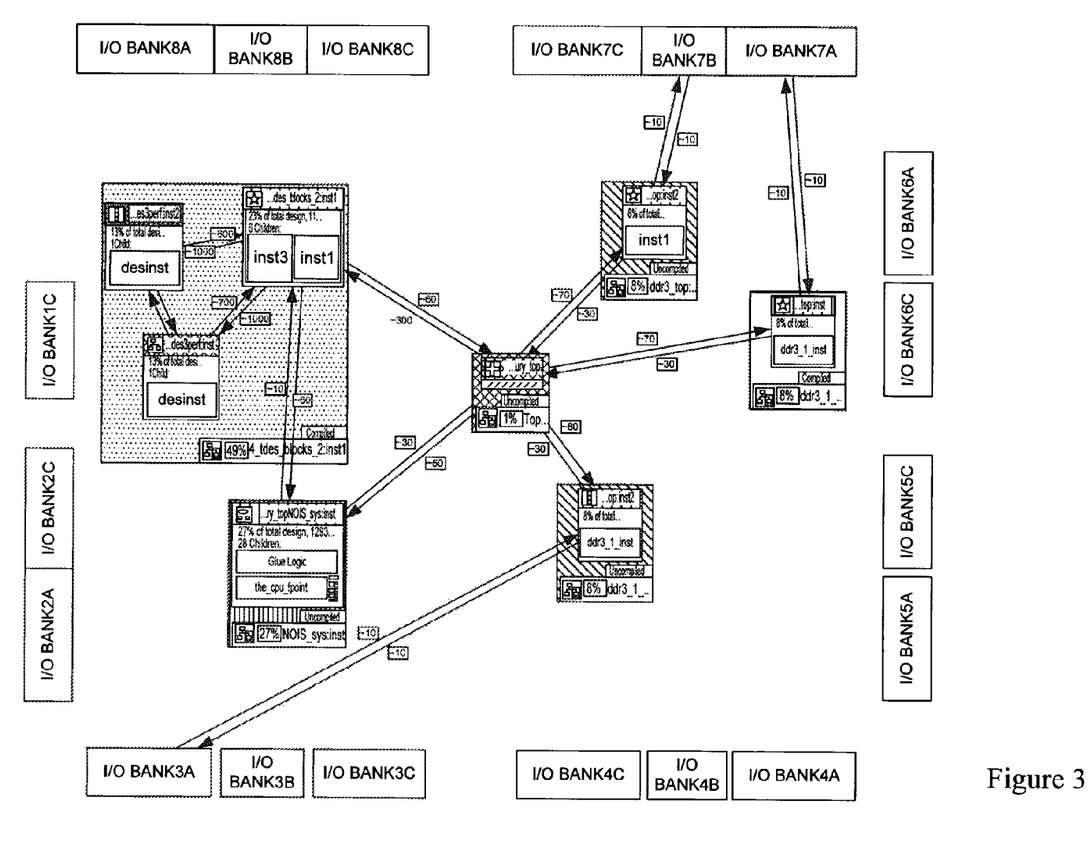
FIG. 3 is a diagrammatic representation showing a logical view in accordance with various embodiments of the present invention.

An example canvas is shown as FIG. 3. In this example many elements are shown on the canvas, including input/output banks, partitions, bundles, and entities representing blocks of logic. The input/output banks are positioned along the outer edges of the canvas. The locations of input/output banks may simulate that of the actual chip. Partitions are as rectangular areas surrounding various blocks. Note that a partition may include one or more blocks, and the blocks shown may be at different hierarchal levels, e.g., a parent block may be shown next to a child block. Bundles connect different entities.

Figure 4:
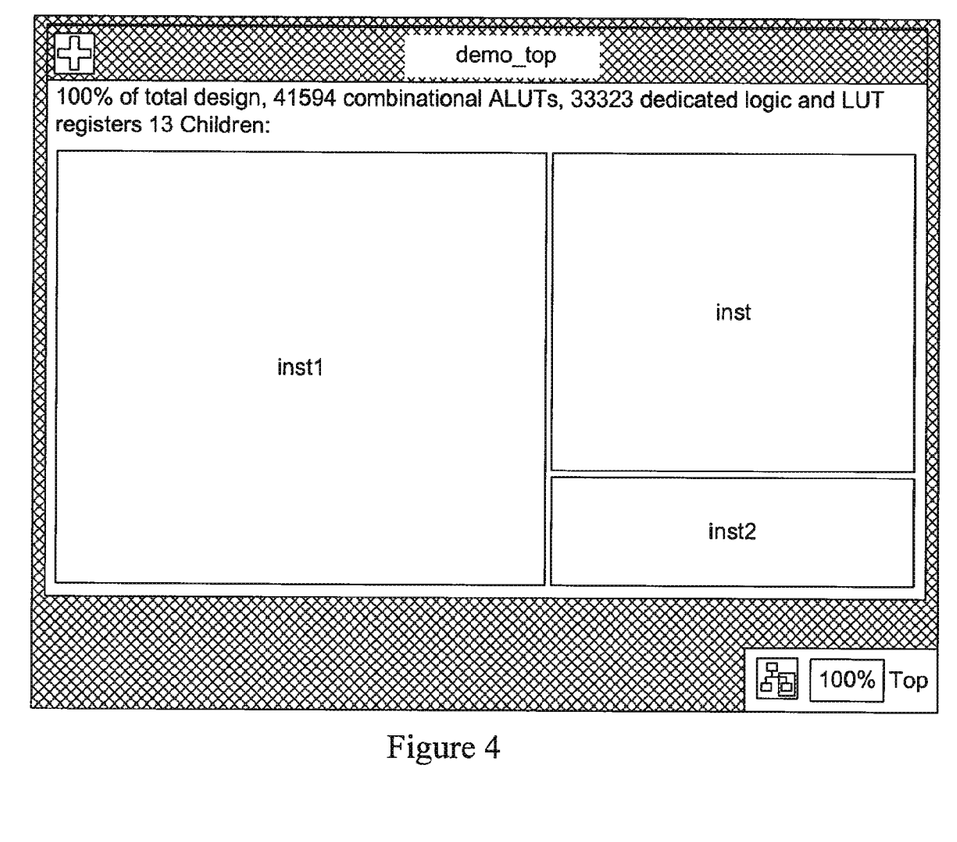
FIG. 4 is a diagrammatic representation depicting a top-level entity in accordance with various embodiments of the present invention.

The initial state of the tool shows the user a box representing the top block of a design (see FIG. 4). The entire design is shown in one box, the top entity. Logic and immediate children of the top entity are contained within the area of this box as separate boxes, shown as inst, inst1, and inst2. No logic box is shown in FIG. 4, but other blocks may include a logic box, e.g., glue logic. The area may be configured to display other types of data. For example, a breakdown of the types of physical resources used in the design may be shown. A comparison of the allocated resources relative to the actual resources used, notes related to this block and user configurable data may be shown. A file location where this block was initialized may also be shown. FIG. 4 shows the block name, percentage of total design, the number of resources (e.g., number of ALUTS number of dedicated logic and LUT registers), and the number of children for that block.

The relative size of each block can be controlled by user configuration. A user can specify how the blocks and the children boxes within each block are sized. The sizing may depend on the amount of logic used, (e.g., logic cells, DSPs, RAMs or any combination of these), a weighted sum of the nodes of the entity, the minimum area on the chip required to fit the physical resources used, the bounding box currently used by the entity, a slack ratio, or other data controlled by the user, e.g., same size boxes or hierarchical structure. The ability to specify sizing according to design needs allows a user to quickly determine from the logical view how the blocks fit into the overall design. A user can also quickly pinpoint problem areas. For example, a slack ratio may indicate blocks with timing issues.

Figure 5:
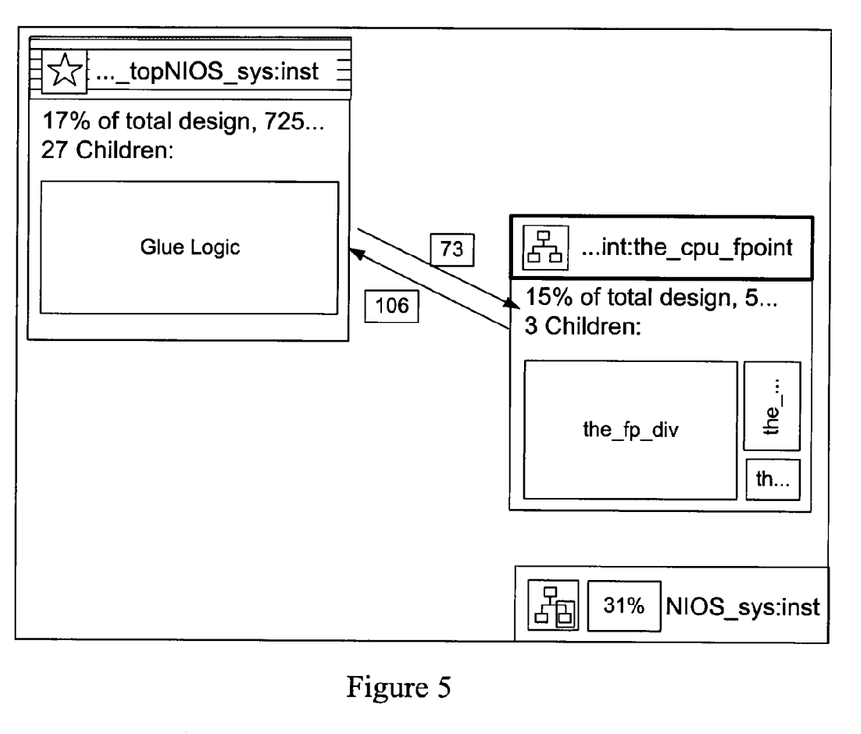
FIG. 5 is a diagrammatic representation depicting two related entities in accordance with various embodiments of the present invention.

A user may extract entities from a block containing child entities. Extracted entities are shown independently from the original block with their own details. A user may drag an entity onto the canvas out from one of its parents, drag an entity from another portion of the software onto the canvas, or select the entity and use the menu or toolbar option to extract it. FIG. 5 shows an extracted entity with its parent. Note that once extracted, a child is no longer shown as a separate box within the parent block. Instead, a bundle connects the two entities.

A user may extract as many entities or as few entities and at various levels of hierarchy to the logical view. A user can "click and drag" each entity on the canvas to form an aesthetically pleasing placement. The tool can also automatically arrange the entities on the logical view. This interaction where users are able to move the blocks around the screen, allows them to explore "what if" scenarios for partitioning and floor planning. The changes a user makes are not committed to the design until the changes are saved. Thus, the user can experiment with different layouts before deciding on a strategy for partitioning.

According to various embodiments, the tool may arrange the blocks in the logical view layout. A user can select for the tool to rearrange the blocks so that highly related blocks are placed together while those that are less highly related are moved further away. A user may define various rules or priority for "highly related." For example, "highly related" may be those blocks with blocks with a certain number of connections between them. "Highly related" may additionally require that these blocks be related, e.g., a parent and a child, on a hierarchy. A user may also include I/O banks in the rules so that blocks are arranged closest to the I/O bank to which more connections are made.

Bundles

Bundles are created between entities or between an entity and an I/O bank in the logical view. A bundle represents all the connections that exist between the two entities. Graphically, it is shown as a line or two lines between the two entities with an attached label. A user may configure the view such that only certain types of bundles are shown. For example, bundles to the top partition may not be shown for clarity purposes. As another example, bundles to I/O banks may not be shown.

A user can configure whether one or two lines are shown. The label attached to each bundle indicates the number of connections. The label on a dual arrow line may indicate a sum of connections in both directions. The label on a single arrow line may indicate connections in one direction only. The label also can be configured to provide extra information such as the number of failing connections, the number of registered connections, the worst-case slack, and other information from the user. The line itself may be formatted with different colors or properties to indicate a configurable bundle state. For example, a red line may show a line that contains timing-critical connections.

Bundles may be configured by defining "connections." A connection may be a physical point-to-point connection between two entities, e.g., a wire or a bus. A connection may be a logical point-to-point connection, e.g., between parent and child, or siblings. A connection may also be a physical end-to-end connection based on a type of source and destination of the path, e.g., keepers, registers, or I/O pins. Connections can be ignored or counted in the bundle based on a number of factors. For example, a user can count only those connections failing timing or only those that are registered. In another example, pass through connections may be ignored. Connections may be differentiated based on the type of routing wires used or the number of entities fed by a connection. Connections may also be defined by the clock domain of the connection or the width of the bus. Connections not counted based on the user defined criteria are hidden from the user until the criteria changes. For example, global signals may be hidden.

A user may drill down into a bundle to see the individual connections through mouse action or menu selection. Individual connections may be shown in a table or list showing the connection properties, e.g., source, destination, whether end points are registered, routing, worst case slack or other user defined data.

Partitions

In accordance with various embodiments, a partition may be shown in the logical view as an entity or a group of entities. A common background area, e.g., a color or a shading type, may be used to indicate partitions. The common partition background may have different shapes, e.g., rectangle, circular, or irregular shapes, to encompass all blocks in the partition. The common partition background may also be applied to each block only. For example, all blocks belonging in partition X may have the same color border or background color or shading, and no shape surrounds these blocks.

A user may configure partitions, create or delete partitions and import or export a partition in the logical view through various mouse or menu functions. The partition may also include partition information. For example, in FIG. 5, partition information is shown on the lower right corner. This information may include details such as name of the partition, the percentage of the design contained by this partition, i.e., 31% of the design, whether the partition includes a floor planning region, and compilation state of the partition. As shown in FIG. 5, a hierarchy detail icon is also shown in the partition information section.

The partition information section may include a label indicating a special state about the partition. For example, whether the partition is compiled, marked as empty, imported, or inherits its properties. If a partition is not compiled, the particular partition contains only estimated data and will need to be compiled before it can be used.

Input/Output (I/O) Banks

I/I banks are groups of input/output blocks through which a board and the chip communicate. According to various embodiments, I/O banks are displayed along the other edges of a canvas. A user may configure to display or not to display the I/O banks.

The I/O banks may be positioned on the canvas at approximately the same locations as the physical device. Relative positions of I/O banks and blocks in a partition are used to determine the potential for floor planning a partition. Proximity and position of these entities may have a large effect on interconnect design and timing between them.

I/O locations are usually assigned based on board, bank and device constraints. In many cases the I/Os to the board are assigned even before any logic is developed. Thus, little or no flexibility remains in placing the I/Os. However, the components of a design may be placed close to the I/O banks used most.

For floor planning, the user identifies a physical part of the device to place an entity. If the entity uses I/Os physically located on opposite ends of the device, that entity cannot be constrained to any region smaller then the entire device. Thus before the user identifies the physical part of the device for the entity, the user may check the I/O locations used by the entity.

Displaying I/O banks and connections when the user is analyzing the design can help make the user aware of potential difficulties if floor planning is later attempted. The I/O bank sizes may be configurable as blocks. For example, the I/O banks may be sized according to the physical area on the device, the number of pins, the size of data, and other user configurable information.

Figure 6:
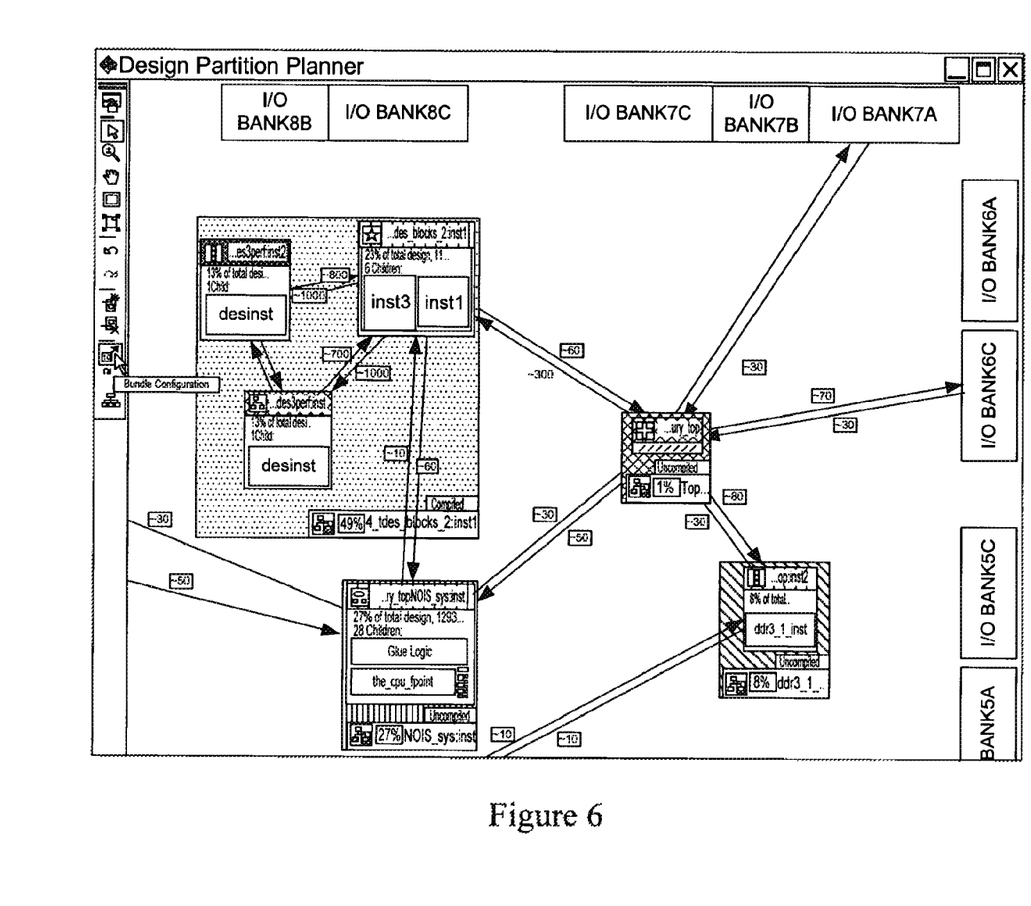
FIG. 6 is a diagrammatic representation depicting a portion of a canvas in accordance with various embodiments of the present invention.

Just like connections between two blocks, bundles also connect I/O banks and blocks. The I/O banks are treated like entities for the purpose of connections and bundles. Bundles are not created between two I/O banks. If the user drags an entity further away exposing more of the canvas, the I/O banks are moved away and the bundle connecting the two is lengthened. The example in FIG. 6 shows the case where the canvas area no longer fits on the screen and the I/O banks are along the border of the larger scrollable area. The bundles connecting to I/O banks that are not shown abstract away the individual pins showing the user only approximations of their location.

Other special blocks can also be drawn along the outer border of the device. Examples of these blocks include transceivers, user nonvolatile memory (UNVM) blocks, and JTAG blocks. Like I/O blocks, the ability to display physical location of these special blocks improves the floor planning efficiency.

Hierarchy View

In accordance with various embodiments, a hierarchy view is available in addition to the logical view on the canvas. A user may use the hierarchy view to see where the current block fits in the logic structure. As discussed above, many of the entities on the canvas include an information section. Some of these information sections include a hierarchy icon for displaying the hierarchy view. A user may toggle between the logical view and the hierarchy view by clicking on this icon or by selecting a menu or tool bar item.

Figure 7:
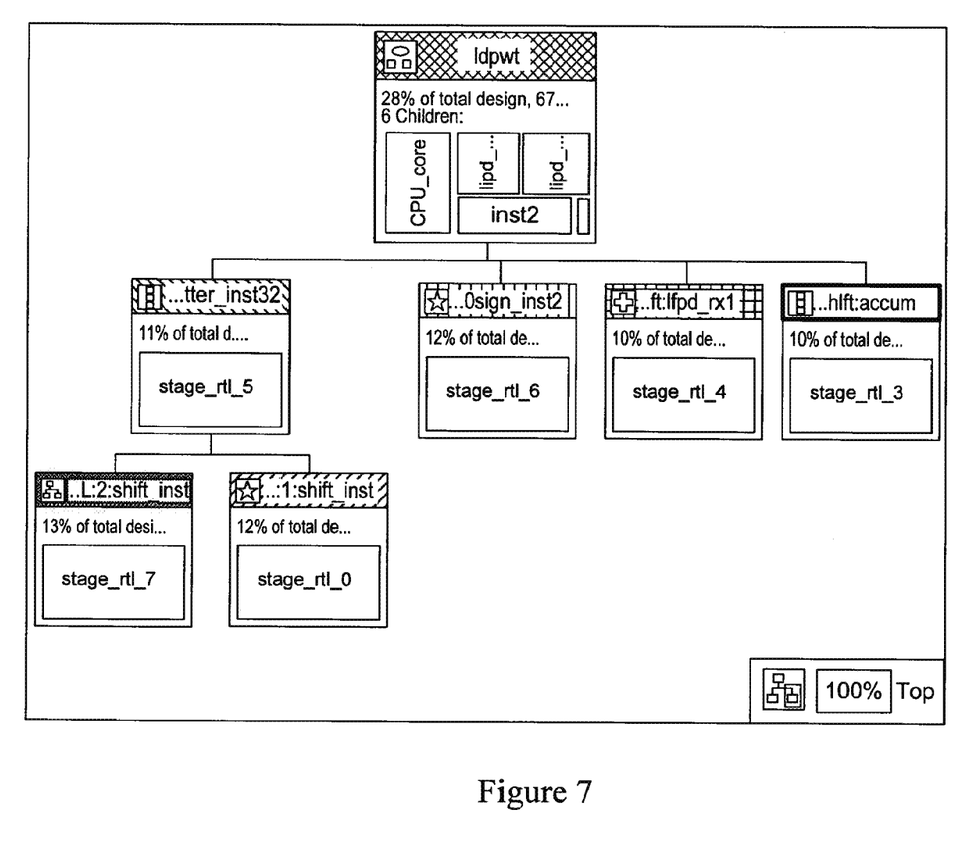
FIG. 7 is a diagrammatic representation depicting a hierarchy view in accordance with various embodiments of the present invention.

FIG. 7 is an example of a hierarchy view. In this view, a tree structure is shown. For example, a parent is shown with a number of children, one of which has two children of its own. Note that the blocks in the hierarchy view are also of different sizes, showing relative proportions as in the logical view.

If the hierarchy view is entered via menu options, the view shown is not centered around a particular block. If the hierarchy view is entered via the hierarchy icons, the view shown may be centered around the block associated with the hierarchy icon. One particular feature of this view is the transition. When the hierarchy icon is selected, the blocks not associated with the entity having the hierarchy icon may be moved relative to the selected entity to form the hierarchy tree. In other embodiments, other relative movement or animation may be used. While it is preferred that a user be able to follow the blocks on the screen to keep track of their position in the hierarchy view, animation is not required. The hierarchy view may be shown on a split screen with the same block colors or be simply redrawn on the screen over the logical view. For example, the user may highlight a block in the logical view to see its corresponding block in the hierarchy view also highlighted. The view may be temporary, e.g., while a button is pressed or until another key is pressed, at which time the blocks move back to their logical view positions or the screen is redraw to display the original view. The hierarchy view is useful to show the user the hierarchy while immediately returning to the logical view.

Timing Display View

The timing display view may be available to display an arrangement of the blocks to highlight failing paths. In this view only entities that include a failing path in the design are "extracted" and shown. The view is also re-arranged such that entities with more failing connections between them are grouped closer together. This allows users to quickly identify the timing critical portions of their design.

Physical View

In accordance with various embodiments, the tool also displays a physical view of the device. As discussed, the ability to see actual positions of various I/O banks may improve floor planning and partitioning. When creating a floor plan the goal is to identify portions of the hierarchy which naturally form into contiguous shapes, e.g., rectangles, on the chip. In the physical view, the actual locations of the various partitions are shown on the device. This view is only available after the design has been compiled through place and route once.

The tool allows users to identify each hierarchical entity's physical placement and determine its suitability for floor planning. In one embodiment, a corresponding color is used to designate the partition on the canvas. The colors within the logical view correspond through matching colors to a physical view of the chip. Other methods to correspond physical area and partitions include highlighting, special borders, or shading. The physical view and the logical view may be shown side by side.

The physical view may include partitioned areas, non-partitioned areas, and unused areas. A user may change the partitions in the logical view and see immediate changes in the physical view. For example, changes (such as extracting or collapsing entities) in the logical view are instantly reflected in the physical view. The user can see results of "what if" scenarios without recompiling the entire design. Similarly when a block is selected in the logical view, it is simultaneously selected in the physical view and vice versa.

This instant location allows users to quickly identify the hierarchies that cluster into contiguous regions of the chip. Using this information, a user can draw logic lock regions that constrain particular blocks to part of the chip based on a previous placement of the design. Because the design is not recompiled, placement information used to generate the physical view does not reflect other design changes that may affect placement.

Figure 8:
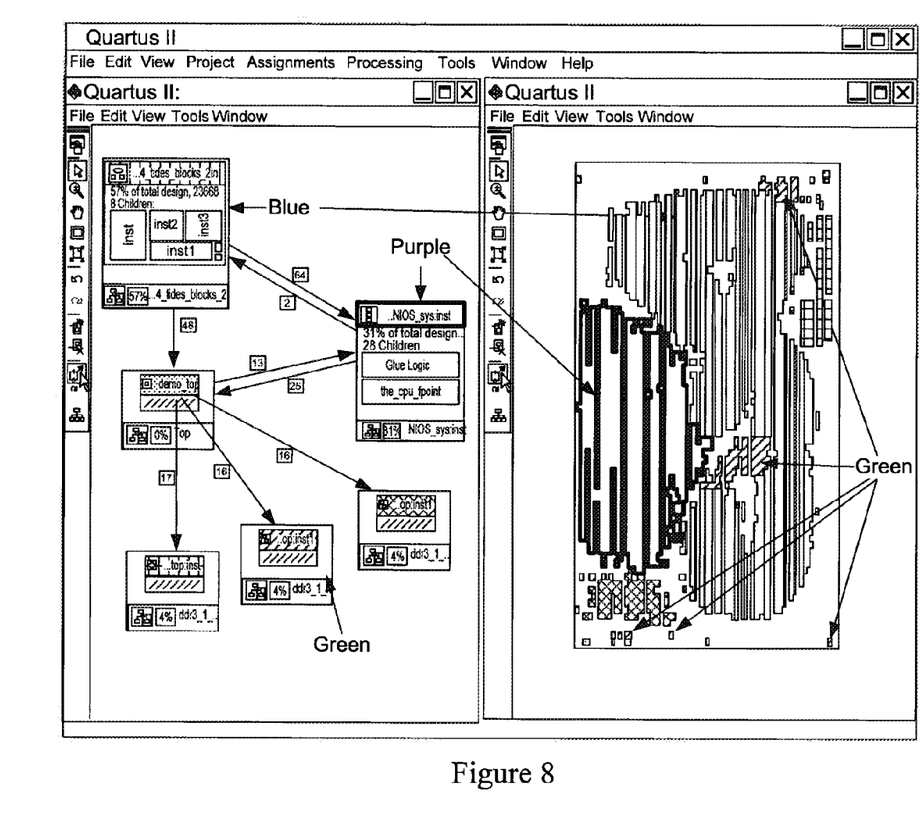
FIG. 8 is a graphical representation depicting a logical view and its corresponding physical view in accordance with various embodiments of the present invention.

FIG. 8 is an example physical view with the logical view. Six partitions are shown in the logical view. These six partitions are also shown in the physical view with the same shading or color. The partition NIOS_sys:int, shown as purple area, is defined by a roughly rectangular area in the physical view and appears to be a suitable partition. On the other hand, partition ddr3_1_, shown as green area in the physical view and represented by a block in the lower middle of the logical view, is represented by at least five separate areas in the physical view. Thus this partition may not be suitable. Note that a portion of the green partition is physically located in the middle of the blue partition, 4_fdes_blocks_2. That portion of the green partition may be better suited, at least area wise, to be a part of the blue partition instead.

The various views, e.g., logical view, hierarchy view, schematic, netlist, and physical view, may be shown singly or in combination. Certain views are in sync so that changes in screen results in a corresponding view change in another. Thus a user can update properties on one side of a split screen and instantaneously see the result on the other side of the split screen. For example, an outline table view of all entities can reflect changes made in the logical view. Other views may be partially in sync. For example, repartitioning in the logical view may be reflected instantly in the physical view by recoloring the physical locations of the entities repartitioned. However, the physical view does not reflect the changes in the physical locations that may result if the entire design is recompiled. The ability to see some changes reflected in a different view allows a user to fully assess the impact of changes and result in better design choices.

Figure 9:
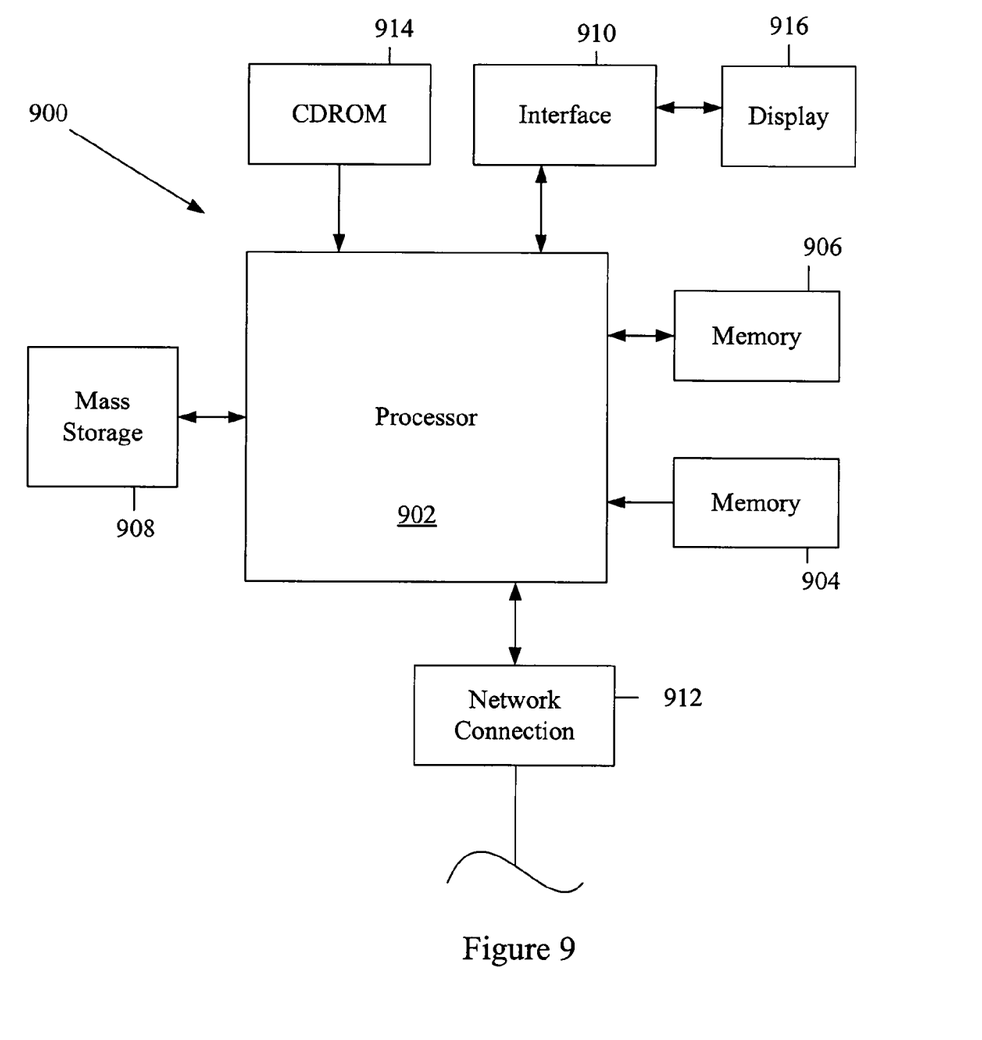
FIG. 9 is a diagrammatic representation depicting a computer system.

The methods described herein may be implemented with a general purpose computer, e.g., a personal computer or an internet server. An example is shown in FIG. 9. Various instructions to perform the methods as described may be stored on tangible computer readable mediums, e.g., mass storage device, internal memory, CD-ROM, DVDs, hard drive, flash memory, or diskettes. The graphical presentation of various views as described may be displayed on a display (e.g., video monitor, projector, or other visual presentation device) connected to the general purpose computer while the instructions are executed on a personal computer or a server through a network connection.

FIG. 9 illustrates a typical computer system that can be used to implement a programmable chip using the various embodiments of the present invention. The computer system 900 includes any number of processors 902 (also referred to as central processing units, or CPUs) that are coupled to devices including memory 906 (typically a random access memory, or "RAM"), memory 904 (typically a read only memory, or "ROM"). The processors 902 can be configured to generate a test sequences for any designated processor. As is well known in the art, memory 904 acts to transfer data and instructions uni-directionally to the CPU and memory 906 is used typically to transfer data and instructions in a bi-directional manner.

Both of these memory devices may include any suitable type of the computer-readable media described above. A mass storage device 908 is also coupled bi-directionally to CPU 902 and provides additional data storage capacity and may include any of the computer-readable media described above. The mass storage device 908 may be used to store programs, data and the like and is typically a secondary storage medium such as a hard disk that is slower than memory. The mass storage device 908 can be used to hold a library or database of prepackaged logic or intellectual property functions, as well as information on generating particular configurations. It will be appreciated that the information retained within the mass storage device 908, may, in appropriate cases, be incorporated in standard fashion as part of memory 906 as virtual memory. A specific mass storage device such as a CD-ROM 914 may also pass data uni-directionally to the CPU.

CPU 902 is also coupled to an interface 910 that includes one or more input/output devices such as such as displays 916, e.g., video monitor, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 902 optionally may be coupled to a computer or telecommunications network using a network connection as shown generally at 912. With such a network connection, it is contemplated that the CPU might receive information from the network, or might output information to the network in the course of performing the above-described method steps. It should be noted that the system 900 may also be associated with devices for transferring completed designs onto a programmable chip. The above-described devices and materials will be familiar to those of skill in the computer hardware and software arts.

Although many of the tools and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, although PLDs and particularly FPGAs are used in the various examples, the present invention is not limited to an implementation involving an FPGA or even a PLD. The apparatus and techniques as disclosed may be applied to logic structures to be implemented on other chips, e.g., ASIC. The present invention also contemplates the use of other types of programmable chip such as Complex Programmable Logic Devices (CPLD). In another example, the present invention may be practiced with a design software type not discussed above. It is therefore intended that the invention be interpreted to include all variations and equivalents that fall within the true spirit and scope of the present invention.

What is claimed is:

1. A method of presenting chip design information on a display, the method comprising:
    using a computing device to present on the display of the computing device at least a first view of a plurality of views of at least two entities, each entity representing a design block or a group of design blocks and having a relative size based on a specified variable; and
    presenting on the display of the computing device at least one bundle, each bundle representing at least one connection between a respective pair of said entities and having a configurable label, wherein:
        the configurable label is operable to display a plurality of connection properties associated with the at least one connection; and
        each of the plurality of views is user-selectable from a group consisting of a logical view, a hierarchical view, and a physical view.

2. The method of claim 1 further comprising:
    displaying on the computing device at least one partition comprising at least one entity.

3. The method of claim 1 further comprising displaying on the computing device I/O banks.

4. The method of claim 3, wherein position of I/O banks on the display is based on position of I/O banks on a programmable logic device (PLD) chip.

5. The method of claim 1, wherein the plurality of connection properties is a number of point-to-point connections between the two entities.

6. The method of claim 5, wherein a hierarchical relationship between entities is not displayed in the logical view.

7. The method of claim 1, wherein the specified variable is selected from a group consisting of: a number of logic elements, a type of logic, a weighted sum of nodes, a minimum area occupied by the plurality of entities, a bounding block, a slack ratio, and a user-defined parameter.

8. The method of claim 1 further comprising displaying on the computing device children of an entity.

9. The method of claim 1 further comprising displaying on the computing device information associated with failed connection.

10. The method of claim 1, wherein the plurality of entities displayed is arranged in the logical view according to a number of connections.

11. A system comprising:
    a computing device including a display; and
    one or more processors configured to:
        present on the display of the computing device at least a first view of a plurality of views of at least two entities, each entity representing a design block or a group of design blocks and having relative size based on a specified variable; and
        present on the display of the computing device at least one bundle, each bundle representing at least one connection between a respective pair of said entities and having a configurable label, wherein:
            the configurable label is operable to display a plurality of connection properties associated with the at least one connection; and
            each of the plurality of views is user-selectable from a group consisting of a logical view, a hierarchical view, and a physical view.

12. The system of claim 11, wherein the one or more processors are further operative to display on the display of the computing device at least one partition comprising at least one entity.

13. The system of claim 11, wherein the one or more processors are further operative to display on the display of the computing device I/O banks.

14. The system of claim 13, wherein position of I/O banks on the display is based on position of I/O banks on a programmable logic device (PLD) chip.

15. The system of claim 11, wherein the plurality of connection properties is a number of point-to-point connections between the two entities.

16. The system of claim 11, wherein the specified variable is selected from a group consisting of: a number of logic elements, a type of logic, a weighted sum of nodes, a minimum area occupied by the plurality of entities, a bounding block, a slack ratio, and a user-defined parameter.

17. A non-transitory tangible computer-readable storage medium storing instructions executable by a computing device to perform a method, the method comprising:

presenting on the display of the computing device at least a first view of a plurality of views of at least two entities, each entity representing a design block or a group of design blocks and having a relative size based on a specified variable; and presenting on the display of the computing device at least one bundle, each bundle representing at least one connection between a respective pair of said entities and having a configurable label, wherein:

the configurable label is operable to display a plurality of connection properties associated with the at least one connection; and each of the plurality of views is user-selectable from a group consisting of a logical view, a hierarchical view, and a physical view.

18. The non-transitory tangible computer-readable storage medium of claim 17, the method further comprising displaying on the computing device I/O banks.

19. The non-transitory tangible computer-readable storage medium of claim 18, wherein position of I/O banks on the display is based on position of I/O banks on a programmable logic device (PLD) chip.

20. The non-transitory tangible computer-readable storage medium of claim 17, wherein the specified variable is selected from a group consisting of: a number of logic elements, a type of logic, a weighted sum of nodes, a minimum area occupied by the plurality of entities, a bounding block, a slack ratio, and a parameter capable of being defined by a user.

* * * * *